United States Patent
Ohyama

[19]

[11] Patent Number: 6,122,304
[45] Date of Patent: Sep. 19, 2000

[54] SEMICONDUCTOR LASER AND OPTICAL PICKUP WITH THE SAME

[75] Inventor: Minoru Ohyama, Yokohama, Japan

[73] Assignee: Victor Company of Japan, Ltd., Yokohama, Japan

[21] Appl. No.: 09/104,095

[22] Filed: Jun. 24, 1998

[30] Foreign Application Priority Data

Jun. 26, 1997 [JP] Japan ................................ 9-185900

[51] Int. Cl.[7] .................................................. H01S 5/14
[52] U.S. Cl. ................................ 372/92; 372/43; 372/99
[58] Field of Search ................................ 372/43–50, 92, 372/97–99

[56] References Cited

U.S. PATENT DOCUMENTS

| 4,528,670 | 7/1985 | Burrus, Jr. et al. | 372/44 |
| 4,803,692 | 2/1989 | Sakano et al. | 372/50 |

FOREIGN PATENT DOCUMENTS

| 56-011623 | 2/1981 | Japan . |
| 56-098723 | 8/1981 | Japan . |
| 59-21054 | 11/1984 | Japan . |
| 61-000941 | 1/1986 | Japan . |
| 61-216148 | 9/1986 | Japan . |
| 5-89465 | 4/1993 | Japan . |
| 5-275785 | 10/1993 | Japan . |
| 6-76344 | 3/1994 | Japan . |
| 9-153660 | 6/1997 | Japan . |

*Primary Examiner*—John D. Lee
*Attorney, Agent, or Firm*—Anderson, Kill & Olick P.C.

[57] ABSTRACT

An optical pickup has a semiconductor laser that emits a laser beam to read information recorded on a storage medium. A length of an internal resonator of the semiconductor laser is set so as to satisfy a relationship of $L_A/(m+1)N < L < L_A/mN$ where $L_A$ is a length of an external resonator constituted by a beam outgoing surface of the semiconductor laser and a beam reflecting surface of the storage medium, L the length of the internal resonator, N an effective refractive index with respect to a waveguide in the semiconductor laser, and m a natural number. The length $L_A$ is set so as to satisfy a relationship of $mNL < L_A < (m+1)NL$.

6 Claims, 7 Drawing Sheets

27
SEMICONDUCTOR LASER AND OPTICAL PICKUP WITH THE SAME

BACKGROUND OF THE INVENTION

This invention relates to a semiconductor laser and an optical pickup with the semiconductor laser. Particularly, this invention relates to an optical pickup with a semiconductor laser which are suitable for reading information recorded on optical information storage media.

In optical discs such as Compact Disc (CD) and Digital Versatile Disc (DVD), and recordable discs (photo-electromagnetic discs) such as MiniDisc (MD) and Magnetic-Optical disc (MO), a laser beam output from a semiconductor laser is irradiated on an information recording layer of a disc, and light reflected therefrom is detected to read the content of the recorded information.

FIG. 1 shows a general state of above, in which a laser beam output from a semiconductor laser 10 is incident onto a beam splitter 12. The laser beam having transmitted through the beam splitter 12 is focussed on an information recording layer of a disc 16 by an objective lens 14. A reflected laser beam subjected to modulation according to the information recorded on the disc 16 transmits through the objective lens 14 and is incident onto the beam splitter 12. The laser beam reflected by the beam splitter 12 is incident onto a photo detector 18 where the laser beam is detected as an electric signal. For the beam splitter 12, a half mirror or a polarization beam splitter are used.

In such an optical disc device as described, out of the outgoing bundle of laser beams from the semiconductor laser 10, a part reflected by the information recording layer of the disc 16 transmits through the beam splitter 12 and is fedback to the semiconductor laser 10. Phenomena such as a longitudinal mode competition or a mode hop occur due to the return beam to appear as a noise so called an intensity noise, which is generally known as "backtalk noise".

The backtalk noise brings forth a lowering of quality of a read signal and an unstable operation. It is therefore necessary for performing a better operation to reduce or remove the backtalk noise. Particularly, in video discs in the LD format, photo-electro-magnetic discs such as MD, MO or the like, and DVD which has low (narrow) system tolerance due to high density, it is contemplated that an improvement against the backtalk noise is essential, so that various countermeasures have been taken. General countermeasures are listed as follows which are methods put to practical use in an optical disc player or the like.

(1) λ/4 plate (λ: wavelength) and polarization beam splitter (PBS)

(2) Beam splitter-branch ratio adjustment (3) High frequency modulation (superposition) and (4) Self-oscillation (Self-pulsation)

The countermeasures (1) and (2) are to reduce the backtalk intensity itself. On the other hand, the countermeasures (3) and (4) are to increase a line width of oscillation spectrum, in other words, to lower time coherence to thereby relatively reduce a noise amplitude.

The countermeasures listed above, however, have following inconveniences.

(1) λ/4 plate and PBS: There is a rise in cost of a price of λ/4 plate, and a difference in price between a polarization beam splitter and a normal beam splitter. In addition, there are inconveniences of complication of assembly and larger-size due to an increase in number of parts, and restriction to miniaturization of the apparatus itself.

(2) Beam splitter-branch ratio adjustment: A satisfactory effect is not obtained, a rise in cost rarely occurs though.

(3) High frequency modulation (superposition): A high frequency superposition circuit (unit) has to be added, resulting in a rise in cost. Further, the high frequency superposition circuit is required to be directly mounted on an optical pickup casing, leading to a larger-size of a movable part and an increase in mass, and to deterioration of access performance. Moreover, there occurs an interference and disturbance to other circuits due to a leakage of an electromagnetic wave, and an electromagnetic shield is necessary to suppress it, rising a cost. In addition, at the time of high frequency superposition, laser will be an intermittent emission in principle. For this reason, even in the same average optical power, an instantaneous peak value of optical intensity is approximately twice that of continuous oscillation, resulting in a laser facet (end) deterioration and a deterioration of reliability which depends on the instantaneous peak value.

(4) Self-oscillation: It is difficult to set conditions of a design and a process for obtaining an operation of self-oscillation having a sufficient strength. Further, at present, it is difficult to keep balance between the self-oscillation and the reduction in threshold current desired in terms of system.

SUMMARY OF THE INVENTION

The present invention provides a semiconductor laser and an optical pickup with the semiconductor laser capable of reducing an influence of backtalk noises.

The present invention provides a semiconductor laser having an internal resonator (cavity), a length of the internal resonator being set so as to satisfy a relationship of $L_A/(m+1)N<L<L_A/mN$ where $L_A$ is a length of an external resonator (cavity) constituted by a beam outgoing surface of the semiconductor laser and a beam reflecting surface of a storage medium recorded on which is information to be read by the semiconductor laser, L the length of the internal resonator, N an effective refractive index with respect to a waveguide in the semiconductor laser, and m a natural number.

Further, the present invention provides an optical pickup having a semiconductor laser with an internal resonator, a length of the internal resonator being set so as to satisfy a relationship of $L_A/(m+1)N<L<L_A/mN$ where $L_A$ is a length of an external resonator constituted by a beam outgoing surface of the semiconductor laser and a beam reflecting surface of a storage medium recorded on which is information to be read by the semiconductor laser, L the length of the internal resonator, N an effective refractive index with respect to a waveguide in the semiconductor laser, and m a natural number.

Further, the present invention provides an optical pickup comprising a semiconductor laser with an internal resonator and an external resonator constituted by a beam outgoing surface of the semiconductor laser and a beam reflecting surface of a storage medium recorded on which is information to be read by the semiconductor laser, the internal resonator being optically coupled to the external resonator via the beam outgoing surface, a length of the external resonator being set so as to satisfy a relationship of $mNL<L_A<(m+1)NL$ where $L_A$ is the length of the external resonator, L a length of the internal resonator, N an effective refractive index with respect to a waveguide in the semiconductor laser, and m a natural number.

DETAILED DESCRIPTION OF PREFERRED EMBODIMENTS

The embodiments of the present invention will now be described in detail. First, for facilitating the understanding of the present invention, the relationship between a fundamental optical constitution of an optical disc system and a backtalk noise will be explained in detail.

In an operation of a semiconductor laser where a laser beam is returned from an information recording layer of a disc, since the information recording layer functions as an external reflecting mirror, there can be considered as a composite resonator as described, for example, in "Fundamental of Semiconductor Laser" edited by the Japan Society of Applied Physics, p93—(Ohm Ltd.).

Figure 1:
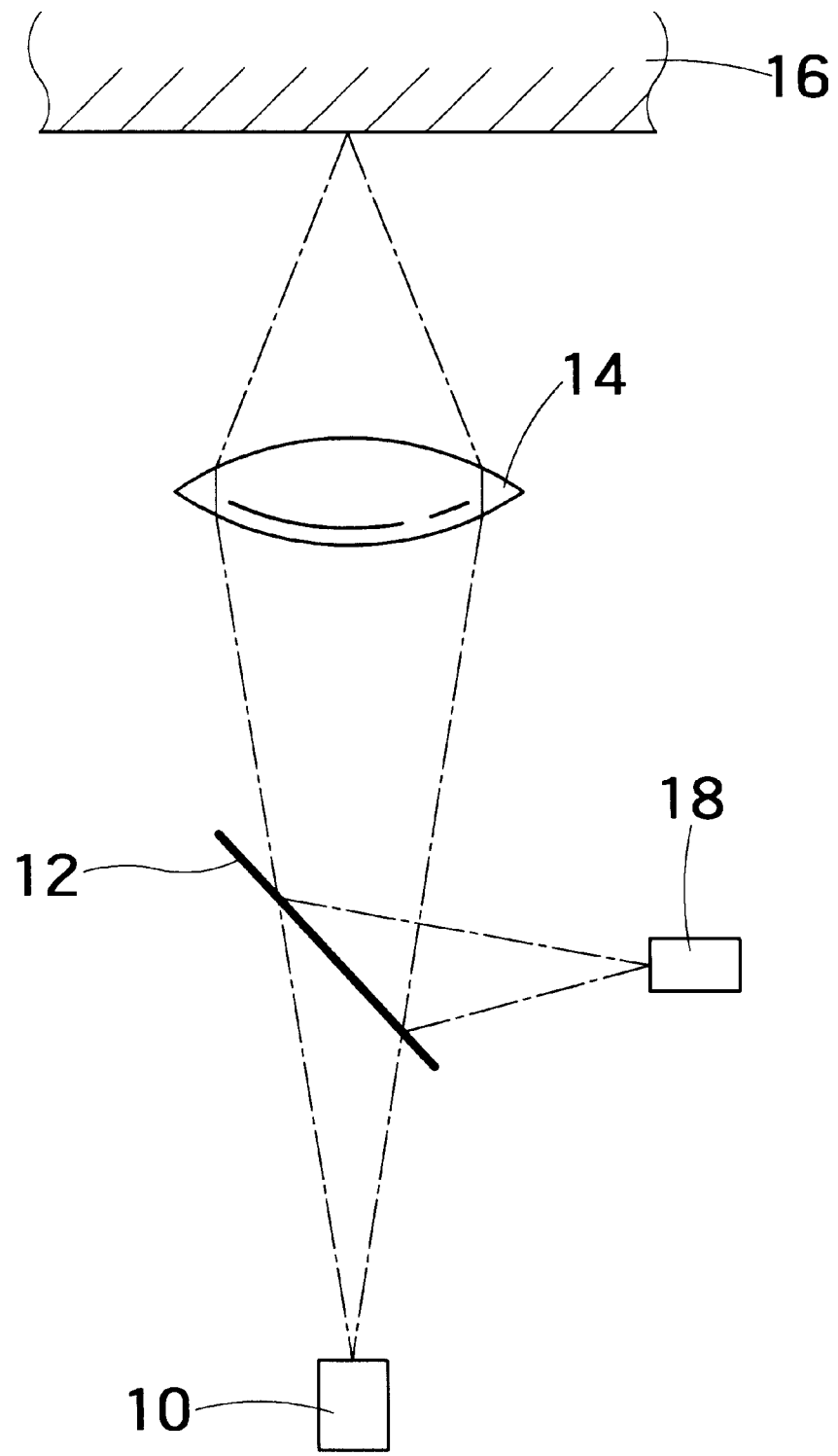
FIG. 1 is a view showing a fundamental constitution of an optical pickup in a disc device.
Figure 2:
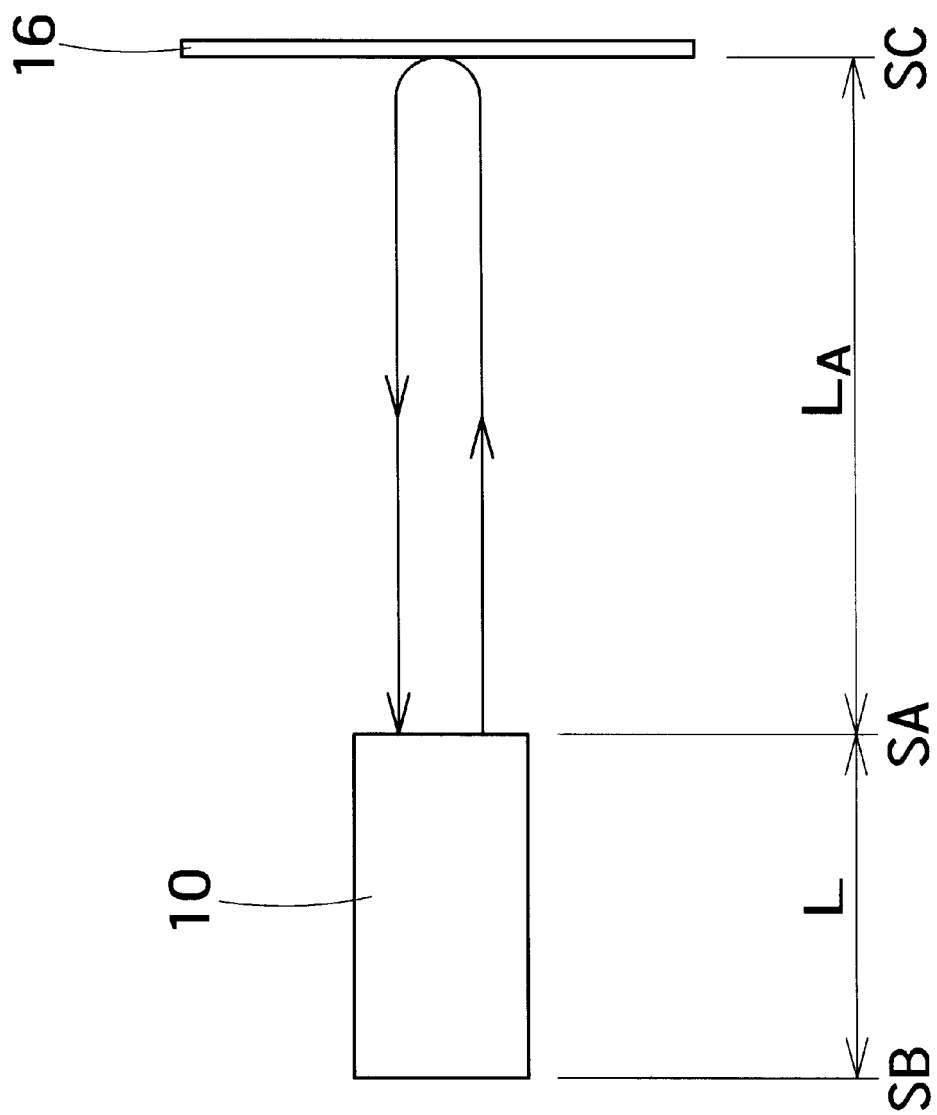
FIG. 2 illustrates a state of a semiconductor laser where a return beam is present.

FIG. 2 shows such a state where a distance between a beam outgoing facet (front end surface) SA and a rear end surface SB of a semiconductor laser 10, that is, a resonance length of an internal resonator is L. The beam outgoing surface SA of the semiconductor laser 10 and a reflecting surface (information recording layer) of a disc 16 that is a cause of the return laser beam constitute an external resonator (Fabry-Perot resonator) with a resonance length $L_A$.

The external resonator is optically coupled to the internal resonator via the beam outgoing surface SA to form a composite resonator. In a general example of a CD player, a re-coupling efficiency of the return beam is approximately 1%, a length L of an internal resonator is approximately 250 $\mu$m, and a length $L_A$ of an external resonator is approximately 25 mm to 35 mm.

In reproduction, an emission point of the semiconductor laser and the reflecting surface SC of the disc 16 are always in the focal positions by focus servo. In other words, the laser emission point and the reflecting surface SC are in an optically conjugate relation (a relation of conjugate points), and the recoupling efficiency is always maintained maximum. The length $L_A$ of the external resonator corresponds to a conjugate length.

The distance between the semiconductor laser 10 and the reflecting surface of the disc 16 varies due to the "surface deflection" of the disc, while maintaining the aforementioned state, and accordingly, the length $L_A$ of the external resonator also varies.

Figure 3A:
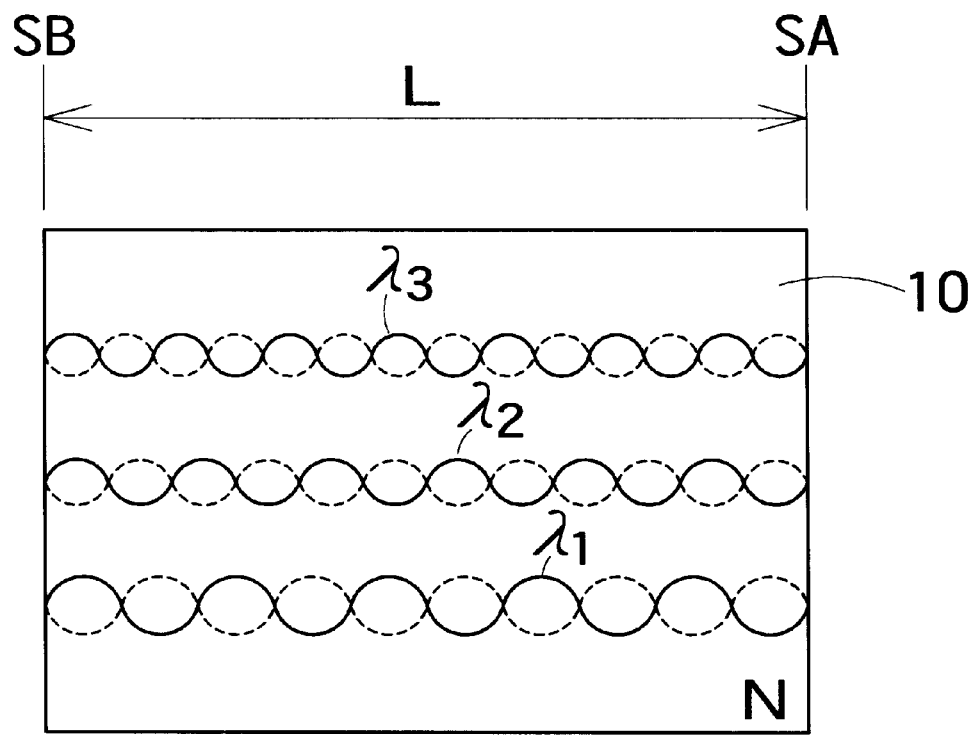
FIGS. 3A and 3B illustrate a state of oscillation of a semiconductor laser in a multi-mode.

Laser oscillation of the semiconductor laser 10 is enabled only at a wavelength where a standing wave exists within the resonator length L between front and rear facets (ends) SA and SB of a semiconductor laser chip, that is, a wavelength which is just one integer with respect to the internal resonator length L, as shown in FIG. 3A.

Figure 3B:
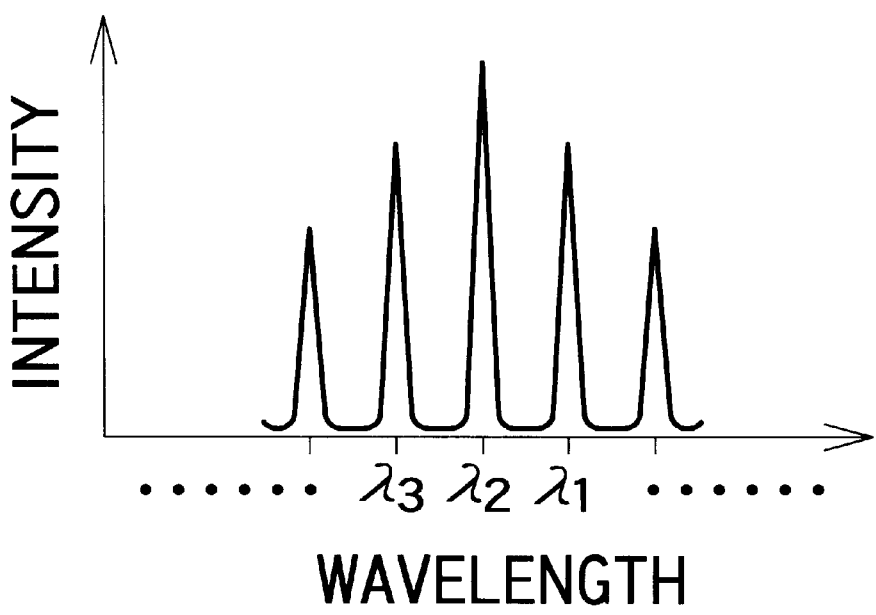

The oscillation under the condition as described above is generally called a longitudinal mode. FIG. 3B shows one example of oscillation spectra. The following relationship is established:

$$NL = m\lambda_1 = (m+1)\lambda_2 = (m+2)\lambda_3 \qquad (1)$$

where L is an internal resonator Length of the semiconductor laser 10, N an effective refractive index in the oscillation condition of a waveguide in the semiconductor laser 10, m a natural number, and $\lambda_1, \lambda_2, \lambda_3 \ldots$ oscillating wavelength at each longitudinal mode. Oscillation is not obtained at other odd wavelengths.

The longitudinal mode of the semiconductor 10 as described becomes a mode hop by the change of the external resonator length as in the aforementioned surface deflection, or a mode competition. It is generally considered that as a result, the light intensity which is the sum of intensity of all the longitudinal modes changes in random at high frequency, and a so-called intensity noise occurs.

It has been considered that an effect of reducing noises with respect to a single mode is obtained by merely setting the oscillation of the semiconductor laser in a multi-mode (See "Fundamental of Semiconductor Laser" edited by the Japan Society of Applied Physics, p87—(Ohm Ltd., previously mentioned).

This can be explained with a model in which, since a phase of a return beam is random with respect to a laser beam in each longitudinal mode, intensities of laser beam in longitudinal modes vary with different phases and cycles with respect to the length $L_A$ of an external resonator, resulting in decrease in change of total laser beam quantity. In reality, it is considered that a discontinuous intensity change due to the mode hop disappears, or it is replaced with the mode competition, that is, a variation of intensity distribution rate of each longitudinal mode.

Even in the multi-mode, however, the phases of the return beams match in all the longitudinal modes under specific conditions. Apparently, from the aforementioned formula (1), the following formulae are simultaneously established:

$$2NL = 2m\lambda_1 = 2(m+1)\lambda_2 = 2(m+2)\lambda_3$$
$$3NL = 3m\lambda_1 = 3(m+1)\lambda_2 = 3(m+2)\lambda_3$$
$$4NL = 4m\lambda_1 = 2(m+1)\lambda_2 = 4(m+2)\lambda_3 \qquad (2)$$

The same is true for 5NL, 6NL, . . . This means that at positions integer times in optical distance with respect to the resonator length L of the semiconductor laser 10, the laser beams oscillated in all the longitudinal modes again assume the same phase.

Figure 4A:
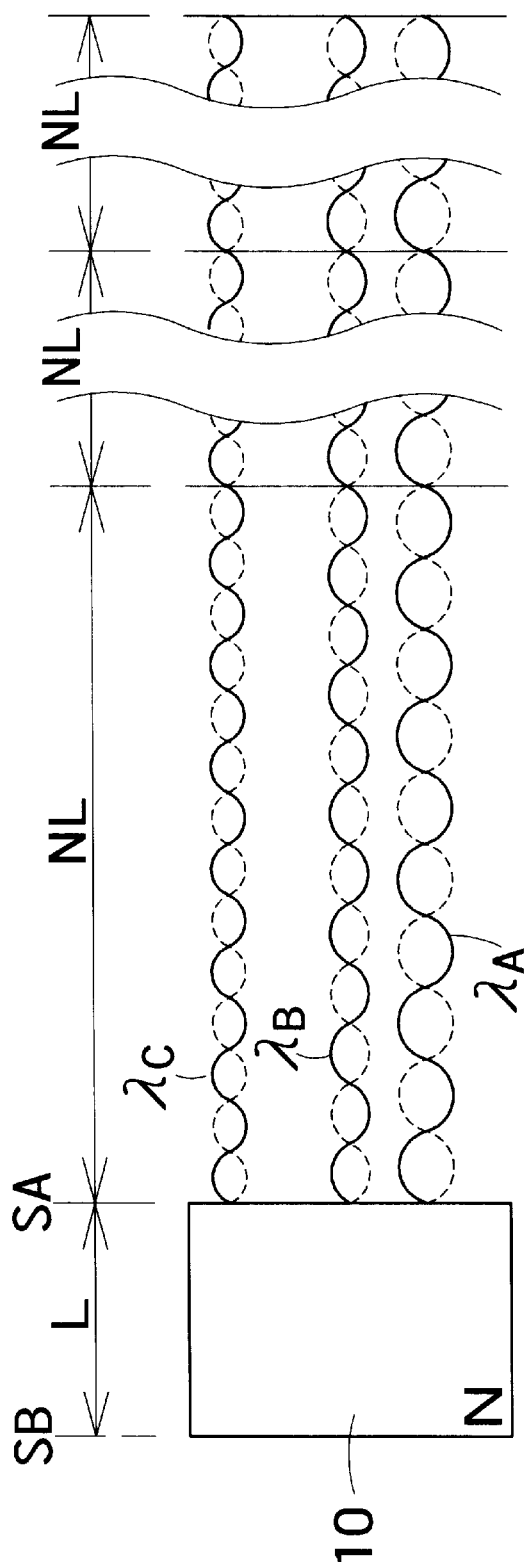
FIGS. 4A and 4b illustrate phase relationships among modes of outgoing laser beams in a multi-mode.

This state is shown in FIG. 4A. At distances of NL from the beam outgoing surface SA of the semiconductor laser 10, that is, at the distances optically equivalent to the internal resonator length L, the phases of laser beams $\lambda_A, \lambda_B, \lambda_C, \ldots$ in all the longitudinal modes again match. Thereafter, similarly, singular points at which the phases match appear by a spacing of NL. For example, in a CD player, NL is about 1 mm where L=250 $\mu$m and N=4.

The foregoing will be further described in detail. A single longitudinal mode (a single waveform) is firstly taken into consideration.

Figure 5:
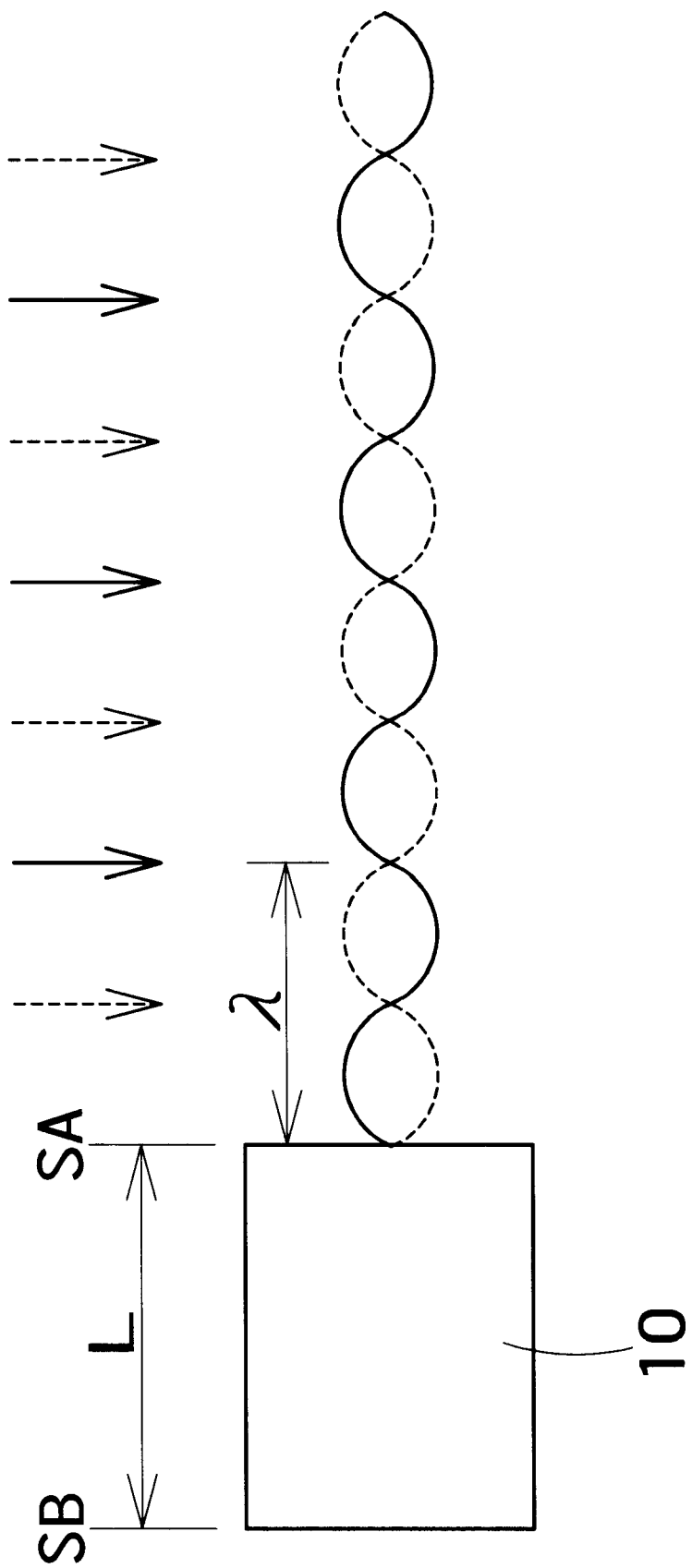
FIG. 5 illustrates a state of phases of an outgoing laser beam in a single mode.

FIG. 5 shows a state of a laser beam in a single mode. In FIG. 5, if a reflecting surface of a disc is present at any positions indicated by arrows in solid line, that is, at positions integer times of one wavelength $\lambda$ from the beam outgoing surface SA of the semiconductor laser 10, the reflected beam resulting -therefrom is to strengthen oscillation in the interior of the semiconductor laser 10.

On the other hand, when the reflecting surface of the disc is present at any positions shown by arrows in dotted line, it is to weaken oscillation in the interior of the semiconductor laser 10, totally conversely the former. Accordingly, in the case where only the single longitudinal mode is taken, for example, in distributed feedback laser diodes (DFB-LD), a displacement of the reflecting surface of the disc induces a change in intensity of the semiconductor laser.

A spatial cycle in which oscillation becomes strong or weak is however, very minute, for example, 780 nm or less, in case of a semiconductor laser for CDs. On the other hand, in the relationship between the disc and the semiconductor laser, there is a large displacement (scores to hundreds $\mu$m) due to the surface deflection of the disc or the like. Accordingly, disc positional control with respect to the spatial cycle as described above is actually impossible.

Next, a case in the longitudinal multi-mode will be explained. In the longitudinal multi-mode, the oscillation is effected in plural modes in which wavelengths are slightly different from each other (for example, 0.3 nm or less). Because of this, deviations in the phase relationships occur among the modes. The phases are deviated from each other as moving away from the beam outgoing surface SA of the semiconductor laser 10, and each phase can be regarded as random in excess of a certain degree of deviation.

Figure 4B:
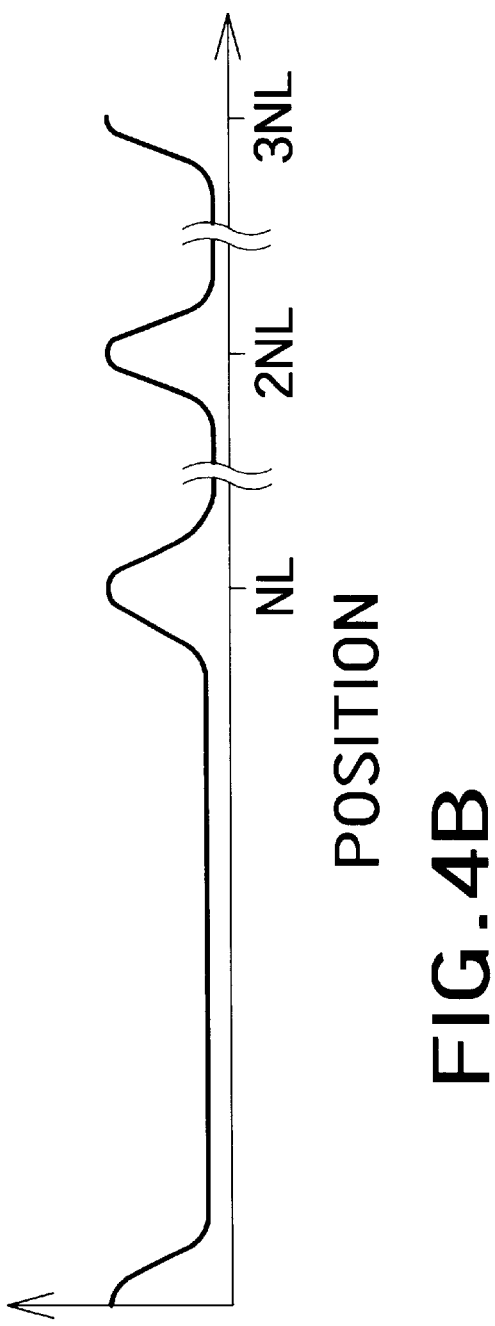

As shown in FIG. 4A, in the vicinity of the beam outgoing surface SA of the semiconductor laser 10, the phases of the laser beams in the respective modes match and this is almost a locking state in the single mode. The noise is thus considered to be relatively large as shown in FIG. 4B.

As moving away from the beam outgoing surface SA, on the other hand, the phases of laser beams in the respective modes become irregular. Because of this, since the change in beam intensity is the sum total in all modes, a changing amount is small and the noise is considered to be small. Actually, however, since the mode hop or the like exists, the phase relationship is generally as described above though not so simple. The relationship between strength and weakness in beam intensity as described above is repeated by a cycle NL.

In other words, the beam intensity varies in the relation of the least common multiple of cycles of the laser beams in the respective modes, and the relative noise intensity is maximum at a position optically equivalent to the beam outgoing surface SA of the semiconductor laser 10.

Accordingly, when the reflecting surface SC of the disc 16 is present at NL or at a position integer times thereof, it becomes equivalent to that the disc 16 is located directly behind the beam outgoing surface SA, and the phases of the laser beams in the longitudinal modes again match. Because of this, this position assumes a state that the optical intensity can sensitively react with a fine displacement of the reflecting surface SC, in other words, this is almost the single mode.

On the other hand, as described above, a displacement occurs due to the surface deflection in the optical disc system, Accordingly, particularly in the vicinity of the positions at which the phases match, the change in beam intensity in a high frequency band appears as a noise, adversely affecting on a reading operation.

In other words, if an external reflection means such as the disc reflecting surface exists at a singular point where the phases match, an externally reflected beam from the disc reflecting surface SC is added in the same phase, at the beam outgoing surface SA of the semiconductor laser 10, to an internally reflected beam caused by the rear end surface SB.

This is equivalent to increase in reflectivity on the end surface of the semiconductor laser. When the reflecting surface SC moves due to the surface deflection or the like, the oscillation varies in synchronism with this movement. This results in the change in total quantity of laser beams, which also leads to an occurrence of intensity noise caused by return beams. Actually, in a noise measuring system for a semiconductor laser and a disc player, there is observed a phenomenon that a noise level increases by the cycle of NL.

It has been known also in a coherence (observability of interference fringes) measurement of a semiconductor laser that, a coherence rapidly increases by the cycle of NL, which supports the aforementioned phenomenon. The ratio of the observability of interference fringes in differences of optical path length "O" and "NL" in the coherence measurement is called "$\gamma$ value", which is an index of noise evaluation of a return beam of a semiconductor laser.

In a composite resonator constituted by the semiconductor laser 10 and the disc 16, a case where the external resonator length $L_A$ corresponds to the singular point (integer times of NL) is unavoidable. Countermeasures against backtalk noises are thus taken with an idea of suppressing the coherence under the worst condition, or selection and evaluation of the semiconductor laser are carried out with the same idea.

More specifically, a countermeasure against backtalk noises by way of widening the width of spectral lines in each longitudinal mode, in other words, increasing a tremble of wavelength has been known. This, however, requires development of a self-pulsation semiconductor.

The foregoing description contains two ways against backtalk noises. One is to reduce return beam intensity itself, and the other increase oscillated spectral line width to relatively reduce noise amplitude.

On the other hand, the present invention focuses on the fact that an oscillated spectrum of a semiconductor laser for a general disc is in the multi-mode, and further on the experimental fact that backtalk noise levels periodically vary as the external resonator length varies.

The present invention thus provides a countermeasure against backtalk noises by way of optimizing a relationship between an external resonator length and a resonator length of a semiconductor laser. In other words, in the invention, a relationship between disc surface deflection and NL is taken into consideration, and optical conditions that even if the surface deflection occurs, it is settled in an area with less noise, are defined with dimensions of both a semiconductor laser and an optical pickup.

Figure 6:
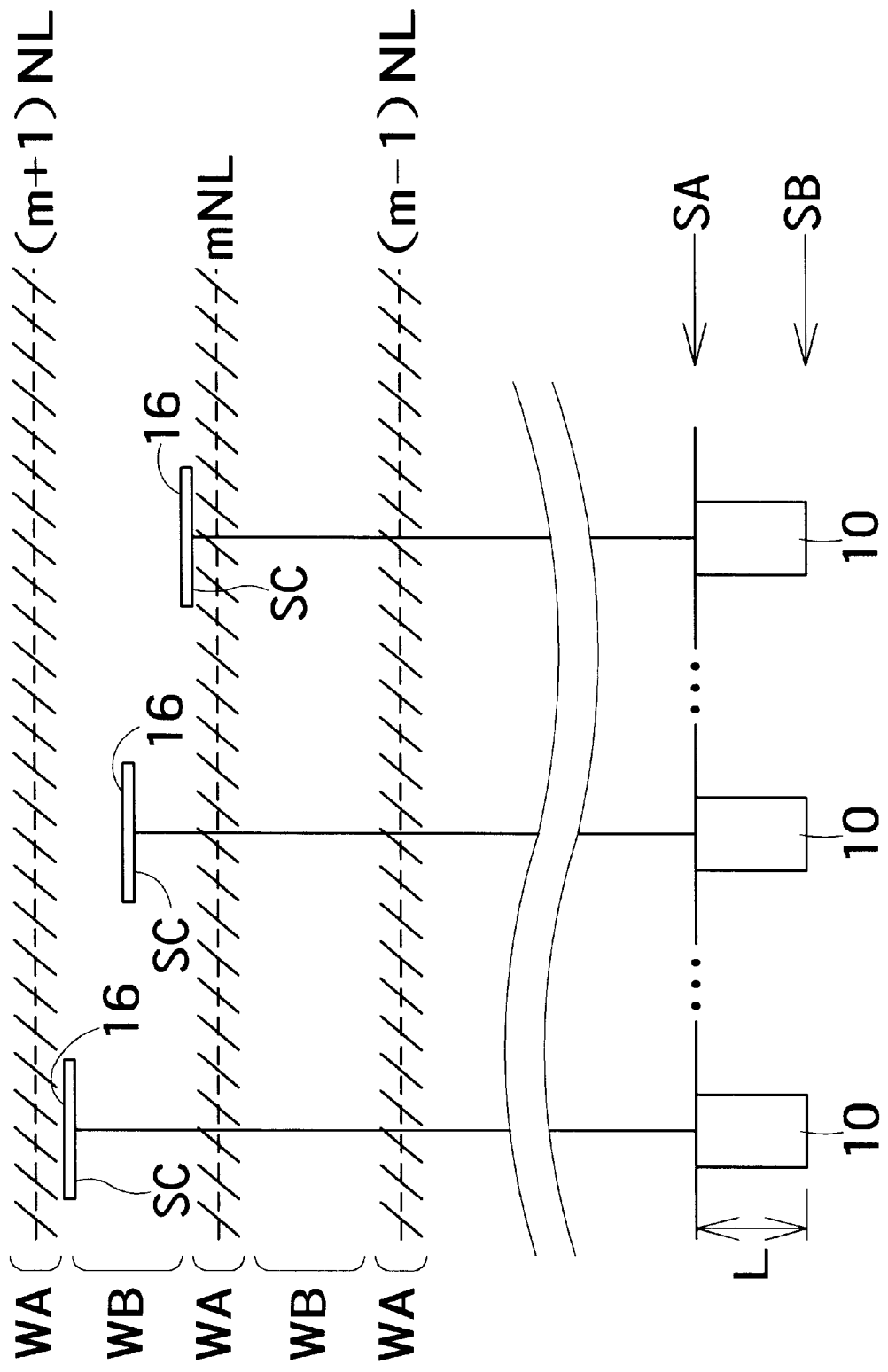
FIGS. 6A to 6C illustrate a model of an optical pickup as an embodiment according to the present invention.

Embodiments of the present invention will be explained hereinafter with reference to FIGS. 6A to 6C. Each figure shows a model of an optical pickup in which a semiconductor laser, a disc and a lens are only shown. As shown, areas where backtalk noises increase are present at positions integer times of NL from the beam outgoing surface SA of the semiconductor laser 10. In other words, the areas are present at positions of NL, 2NL, . . . , (m−1)NL, mNL, (m+1)NL . . . where m is a natural number. In the figures, noise increased areas WA at positions of (m−1)NL, mNL, and (m+1)NL are depicted by oblique lines.

On the other hand, the reflecting surface SC of the disc 16 is displaced due to the surface deflection as described above. Accordingly, if a range of the surface deflection is settled in a nodal area WB placed between the noise increased areas WA, the backtalk noise is reduced. In the illustrated example, the range of the surface deflection is settled between mNL and (m+1)NL. FIG. 6A shows a upper limit position of the surface deflection, FIG. 6B a standard position of the surface deflection, and FIG. 6C a lower limit position of the surface deflection. Such a condition is expressed by a formula as follows:

$$mNL < L_A < (m+1)NL \quad (3)$$

which indicates the external resonator length $L_A$ (external resonator length between the laser beam outgoing surface SA as an emission point and the disc reflecting surface SC as a focal point) $L_A$ is present between mNL and (m+1)NL.

Further, the surface deflection range is required to be settled in the nodal area WB placed between the noise increased areas WA. Accordingly, the surface deflection amount d is $$d < NL \quad (4)$$

Such formulae as described above can be expressed as follows according to various conditions.

(1) Where Adjustment is Made on the Semiconductor Laser 10 side

In this case, the laser internal resonator length L of the laser may be adjusted so as to satisfy $$L_A/(m+1)N < L < L_A/mN \quad (5)$$

by modifying the aforementioned formula (3) with respect to the external resonator length $L_A$, the laser internal resonator length L of the laser, the effective refractive index N in laser, and a natural number m.

For example, in case of λ of laser beam=780 nm, external resonator length $L_A$=20.5 mm, and the effective refractive index N in laser=4, the laser internal resonator length L 250 μm. The adjusting procedure on the laser side as described is very convenient in the case where an optical pickup system has already been determined and countermeasures against backtalk noise are required to be taken on the laser side.

(2) Where There is Surface Deflection of the Disc

In this case, the following condition should be further satisfied. That is, the laser internal resonator length L is determined so as to satisfy the relationship of $$dm/N < L \quad (6)$$

with respect to the surface deflection amount d (a relative displacement amount of the distance between the disc reflecting surface and the optical pickup casing).

For example, in case of wavelength λ of laser beam =780 nm, surface deflection amount d=1.0 mmpp (surface deflection at ±0.5 mm), and effective refractive index in laser N=4, the laser internal resonator length L is 300 μm. Such an adjusting procedure is very convenient in case of a disc system in which the surface defection is present, wherein the laser internal resonator length is taken long to achieve the condition expressed by the formula (4).

(3) Where the Distance Between the Optical Pickup and the Disc is Adjusted

The external resonator length $L_A$ may be adjusted where the assembly accuracy of the semiconductor laser has unevenness. This adjustment is carried out so that the external resonator length $L_A$ satisfies the formula (3).

Figure 7:
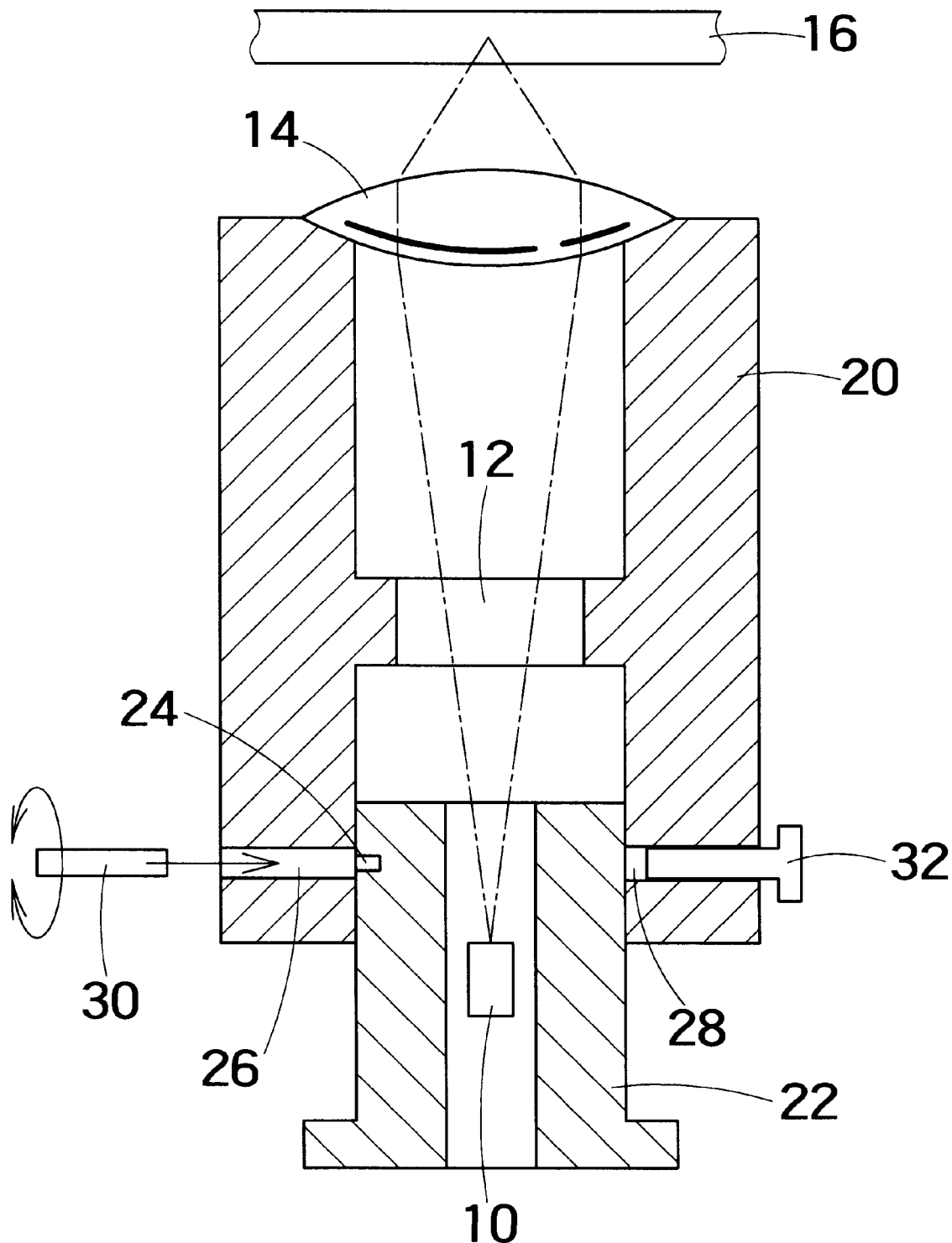
FIG. 7 is a view showing an example of an adjuster to adjust an external resonator length.

For example, this can be achieved by the constitution as shown in FIG. 7. In this figure, on one end of an optical pickup casing 20, a slide portion 22 is provided movably up and down in the figure, and the semiconductor laser 10 is received within the slide portion 22. A beam splitter 12 is provided in the vicinity of the center of the optical pickup casing 20, and an objective lens 14 is provided on the other end thereof. A hole 24 is formed on one side of the slide portion 22. An eccentric pin hole 26 is formed so as to be in communication with the hole 24. Further, a fixed pin hole 28 is formed on the optical pickup casing 20.

In this embodiment, the semiconductor laser 10 is moved by the slide portion 22 to adjust the external resonator length $L_A$. In detail, an eccentric portion at the end of an eccentric pin 30 is inserted into the hole 24 of the slide portion 22 through the eccentric pin hole 26. Rotation of the eccentric pin 30 provides displacement of the slide portion 22 while being rotated up and down due to the eccentricity to adjust the external resonator length $L_A$. After the adjustment, the slide portion 22 is fixed by a fixing pin 32.

In this case, if an adjustable range S of the adjusting mechanism shown in FIG. 7 for the external light path length $L_A$ satisfies $$NL < S \quad (7)$$

then, adjustment can be made to reduce backtalk noises, even if unevenness of the assembly accuracy is considerably large so that the initial state cannot be supposed. For example, in case of λ=780 nm, L=250 μm, and N=4, the adjustable range S is 1.2 mm.

Next, application of the present invention to well-known CD and DVD systems will be explained.

(1) CD System

A semiconductor laser with a wavelength of 780 nm for CDs provides the laser internal resonator length L of approximately 250 gm and the effective refractive index N of approximately 4, thus NL being approximately 1 mm.

In other words, the external resonator length $L_A$ determined by an optical arrangement of optical pickup and disc of integer times of NL (approximately 1 mm) corresponds to a singular point at which the phases of laser beams match, thus backtalk noises tend to occur.

As previously mentioned, the distance between an optical pickup and a disc varies with the surface deflection, and the external resonator length $L_A$ also varies. In case of CD, generally, approximately 1 mm (±10.5 mm) of the surface deflection d is estimated taking a standard of disc and other factors into consideration.

The spacing NL among the singular points is thus substantially equal to a variation range of the external resonator length $L_A$. Therefore, setting an end of the variation range to be in coincidence with a singular point may provide a generally good noise reduction.

However, when the unevenness of preparation accuracy of the internal resonance length L of the semiconductor laser 10 and mechanical accuracy of the optical pickup is taken into consideration, there is actually a high danger of entry of singular points into the surface deflection range. Realistically, there appears a periodicity in the behavior of occurrence of noises in the case where the external resonator length $L_A$ is intentionally varied by the optical pickup. There are, however, differences among products in noise occurrence position in the surface deflection setting range d (actually, the movable range of an objective lens actuator).

The present invention, accordingly, can be achieved by applying small-scaled improvements such that the internal resonator length L of the semiconductor laser 10 is slightly extended; a tolerance of the internal resonator length L is made severe; a middle point of the actuator movable range is set to the neighborhood of a middle point between singular points of noise occurrence in designing an optical system; or the adjusting mechanism shown in FIG. 7 with the external light path length $L_A$ is provided within the optical pickup.

(2) DVD System

A semiconductor laser in the band of 630 nm to 650 nm is used for DVDs. The laser internal resonator length L is generally approximately 400 μm to 650 μm, and the effective refractive index N is approximately 4 substantially similar to that of CDs. The spacing NL among singular points thus becomes wide, that is, 1.6 mm to 2.6 mm.

On the other hand, the surface deflection range d of the disc is equal to or less than that of CDs (within 1 mm). Hence, a normal tolerance setting with the external light path length $L_A$ in consideration of the aforementioned conditions in designing optics provides full avoidance of noise occurrence of return beam caused by singular points.

As described above, the present invention can be applied to the CD system, but rather the present invention can be easily achieved in the DVD system which requires countermeasures against backtalk noises, providing a great effect as well.

There are many embodiments for the present invention, and various modifications can be made on the basis of the disclosure as described above. For example, while in the above-described embodiments, a description has been made of examples of CD system and DVD system, it is to be noted that the present invention is not limited thereto.

As described above, according to the present invention, attention has been paid to the relationship between the external resonator length between the optical pickup and the disc and the backtalk noises of the semiconductor laser so as to satisfy the specific optical conditions.

The present invention thus achieves significant reduction of influence of backtalk noises without increase in cost and the larger-scale of apparatus due to the increase in number of parts.

Further, the present invention achieves a stable optical pickup operation.

Furthermore, the present invention achieves a signal detection of high quality.

What is claimed is:

1. An optical pickup for reading information stored on a storage medium by means of a laser beam reflected from a beam reflecting surface of the storage medium, the pickup comprising a laser, the output beam of which is focussed in use onto a point on the storage medium, wherein said laser is a longitudinal multi-mode semiconductor laser having:

a geometrical internal resonator length "L" between front and rear ends of a multi-mode semiconductor laser chip of the semiconductor laser, satisfying the relation d/N<L where "N" is the effective refractive index of the laser and "d" is a relative displacement amount of the distance between the semiconductor laser and the storage medium, and an optical external resonator length "$L_A$" satisfying the relation mNL<$L_A$<(m+1)NL where "mi" is a natural number and "$L_A$" is the length between the beam outgoing surface of the laser and the point on which the beam is focussed.

2. The optical pickup according to claim 1, further comprising an adjuster to adjust the optical external resonator length "$L_A$", within an adjustable range "S" being defined as NL<S.

3. The optical pickup according to claim 2, wherein the adjuster comprises a slider containing the semiconductor laser, the slider being movable in a direction of a laser beam emitted from the beam outgoing surface of the semiconductor laser.

4. The optical pickup according to claim 3 further comprising an eccentric pin that is inserted into a hole formed on the slider, the eccentric pin being rotated to displace the slider while moving in the direction of the laser beam.

5. A method of producing a longitudinal multi-mode semiconductor laser of an optical pickup for reading information stored on a storage medium by means of a laser beam reflected from a beam reflecting surface of the storage medium, reducing generation of noises due to the reflected beam by canceling an optical external resonator length "$L_A$" corresponding to an integer multiple of a geometrical internal resonator length "L", the method comprising the steps of:

setting a geometrical internal resonator length "L" between front and rear ends of a multi-mode semiconductor laser chip of the semiconductor laser so as to satisfy a relationship d/N<L where "N" is an effective refractive index of the semiconductor laser and "d" is a relative displacement amount of the distance between the semiconductor laser and the storage medium, and setting an optical external resonator length "$L_A$" of the semiconductor laser so as to satisfy another relationship mNL<$L_A$<(m+1)NL where "m" is a natural number and "$L_A$" is the optical external resonator length between a beam outgoing surface of the semiconductor laser and the point on which the beam is focussed, thus reducing generation of noises due to a beam reflected by the beam reflecting surface within the relative displacement "d".

6. The method according to claim 5, further comprising the step of adjusting the optical external resonator length "$L_A$ within an adjustable range "S" being defined as NL<S.

* * * * *